(12) United States Patent
Chen

(10) Patent No.: US 6,489,854 B1
(45) Date of Patent: Dec. 3, 2002

(54) ELECTRONIC APPARATUS FOR AUTOMATICALLY DETECTING THE LENGTH OF NETWORK TRANSMISSION LINES

(75) Inventor: Sun-Chung Chen, Hsichin (TW)

(73) Assignee: Aten International Co., Ltd. (TW)

( * ) Notice: Subject to any disclaimer, the term of this patent is extended or adjusted under 35 U.S.C. 154(b) by 0 days.

(21) Appl. No.: 09/996,515

(22) Filed: Nov. 28, 2001

(51) Int. Cl.[7] ............................ H03H 11/30; G01B 7/02
(52) U.S. Cl. .................... 333/17.1; 333/17.3; 324/607; 364/562
(58) Field of Search ........................... 333/17.1, 17.3; 324/607; 364/562

(56) References Cited

U.S. PATENT DOCUMENTS

| | | | | |
|---|---|---|---|---|
| 5,321,632 A | * | 6/1994 | Otsuji et al. ................ | 364/562 |
| 5,337,025 A | * | 8/1994 | Polhemus ................ | 333/28 R |
| 5,801,818 A | * | 9/1998 | Corrigan et al. ........... | 356/5.01 |
| 6,377,629 B1 | * | 4/2002 | Stewart et al. .............. | 375/257 |

* cited by examiner

Primary Examiner—Robert Pascal
Assistant Examiner—Barbara Summons
(74) Attorney, Agent, or Firm—BakerBotts LLP

(57) ABSTRACT

An electronic apparatus for automatically detecting the length of network transmission lines. The electronic apparatus essentially comprises a detection device, an analog/digital (A/D) converter, a microprocessor, a frequency compensator and a transmission network line, such as an RJ-45 network transmission line. The electronic apparatus utilizes the detection device to detect a frequency response of the reference signal for generating detection signals and converts the detection signals into digital signal. Thereafter, the microprocessor outputs a control signal so that the frequency compensator, comprising resistors and capacitors, makes up for the video frequency according to the control signal. As a result, the optimum video frequency is generated to display a clear image on a monitor for the benefit of the operation.

20 Claims, 3 Drawing Sheets

ELECTRONIC APPARATUS FOR AUTOMATICALLY DETECTING THE LENGTH OF NETWORK TRANSMISSION LINES

FIELD OF THE INVENTION

The present invention generally relates to an apparatus for detecting a transmission line, and more particularly, to an electronic apparatus for automatically detecting the length of a network transmission line.

BACKGROUND OF THE INVENTION

With rapid developments of the electronics industry and computer technology, many electronic products are more and more widely used to improve quality of life. Particularly, many monitors for computer systems are utilized in the office and factory. In general, a color-added method is often used for color mixing to display colors on the monitor. In other words, the three primary colors, red, blue, and green generate a variety of images by superposition. In addition, the display intensity of the images is adjusted by controlling the voltage of output signals since monitors are analog modes normally so that all the pixels can be displayed in continuous color levels for a high quality display.

The video graphics array (VGA) is often used as the standard display specification. The VGA display mode can support the text mode and the graphic mode, which are compatible with most types of monitors used in computer systems. FIG. 1 shows a transmission mode of VGA video frequency in accordance with the prior art. In the computer system 100, a VGA video frequency signal is transmitted into the monitor 106 from video adapter 102 via network transmission line 104. However, the VGA video frequency signal decays due to the difference of impedance matching. If the VGA video frequency signal is under-balanced, the images are not clear when observed on the monitor 106. In contrast, if the VGA video frequency signal is over-balanced, over-excited signals are formed on the display, resulting in a reduction of monitor lifetime.

Specifically, various types of network transmission lines 104, such as a shielding twisted pair (STP) and a foil twisted pair (FTP), have distinct frequency responses. In the period of transmission, the VGA video frequency signal exhibits a severe decay phenomenon. When the length of network transmission line 106 is over ten meters, the video frequency signal is considerably lessened. This may degrade the quality of display images and even cause an operation error because of the unclear display.

Consequently, there is a need for an optimum video frequency to show clear display images so that the operation efficiency of the computer systems 100 is substantially increased while computer systems are transferring video frequency signal.

SUMMARY OF THE INVENTION

In view of the problems encountered with video frequency signal of the conventional monitor, conventional transmission is severely limited by the length of the transmission line. Video frequency cannot be transmitted to a remote monitor since the video frequency decays considerably.

As a result, the primary object of the present invention is to utilize an electronic apparatus for detecting a reference signal referred to generate a detection signal and to output a control signal via a microprocessor.

Another object of the present invention is to convert the video frequency signal into a differential signal which is incorporated into a control signal and outputted into a compensator device to make up for the differential signal and eventually form clear images on the monitor.

According to the above objects, the present invention sets forth the electronic apparatus for automatically detecting the length of a network transmission line. The electronic apparatus comprises a detection device, an analog/digital (A/D) converter, a microprocessor, a frequency compensator and a network transmission line, such as RJ-45 network line, connected to a remote computer server.

The detection device for generating the frequency response of a reference signal essentially comprises a transistor detector, a temperature compensation circuit, an emitting follower, a zero-adjusting circuit and a differential amplifier.

The transistor detector is used to detect a detection level of the reference signal. The zero-adjusting circuit can generate a zero level for reference. The differential amplifier amplifies the difference between the detection level and the zero level to generate a detection signal. Preferably, the differential amplifier includes a plurality of amplifiers and resistors.

The analog/digital (A/D) converter, coupled to the detection device, is able to convert the detection signal from the detection device into a digital signal to generate a full-scale level via a reference voltage. The microprocessor, coupled to the A/D converter, transfers digital signals into control signals to simultaneously control a plurality of switches for decaying the over-compensation portion of the video frequency.

The frequency compensator, coupled to the microprocessor via a network transmission line, comprises a frequency-gained circuit, a negative decayed device, a pull-up circuit, a positive decayed device and other amplified circuits. The frequency-gained device is used to adjust the bandwidth of the video frequency to the maximum level corresponding to the maximum length of the transmission line. The negative decayed device, coupled to the frequency-gained circuit, is able to decay the over-compensation portion of the video frequency for calibrating the video frequency. The pull-up circuit receives the video frequency and then increases the signal level of video frequency, such as the signal level between base and emitter (BE) of a transistor.

The positive decayed device, coupled to the pull-up circuit, is capable of decaying a positive over-compensation portion of the video frequency. Thereafter the negative over-compensation portion and the positive over-compensation portion of the video frequency are simultaneously output to a monitor by the differential amplifier. The positive decayed device preferably comprises a plurality of decayed circuits. Additionally, the electronic apparatus has connectors, such as RJ-45 and RJ-11 connectors, for receiving the transmission line in remote computer systems.

In summary, the electronic apparatus allows detection of the length of the transmission line and then generates a compensated video frequency signal which is output into the monitor such that the remote monitor can display a clear image for the benefits of operation convenience.

BRIEF DESCRIPTION OF THE DRAWINGS

The foregoing aspects and many of the attendant advantages of this invention will become more readily appreciated as the same becomes better understood by reference to the following detailed description when taken in conjunction with the accompanying drawings, wherein.

DETAILED DESCRIPTION OF THE PREFERRED EMBODIMENT

The present invention is directed to an electronic apparatus for automatically detecting the lengths and frequency responses corresponding to various network transmission lines, such as a RJ-45 network transmission line and the like. In operation, a detection device detects the frequency response from a transmission network line in which the frequency response corresponds to the length of the transmission network line. More importantly, the electronic apparatus can compensate a video frequency according to the frequency response so that optimum video frequency signals can be shown on a monitor to form a clear image. These video frequency signals at least comprise three primary colors with respect to the VGA signals, SVGA signals and the like.

Figure 1:
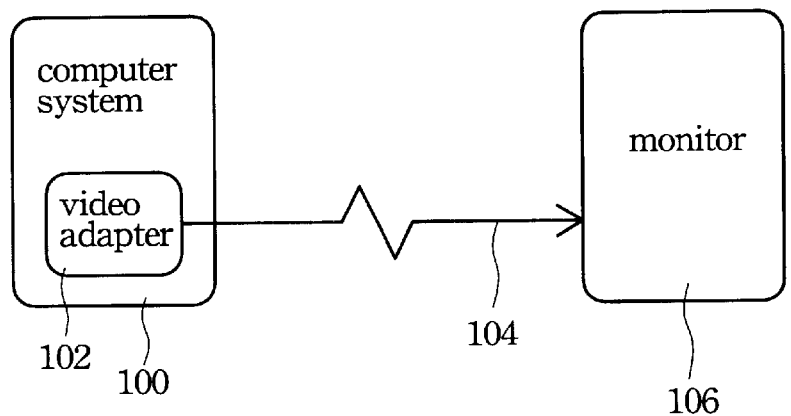
FIG. 1 illustrates a transmission mode of VGA video frequency in accordance with the prior art.
Figure 2:
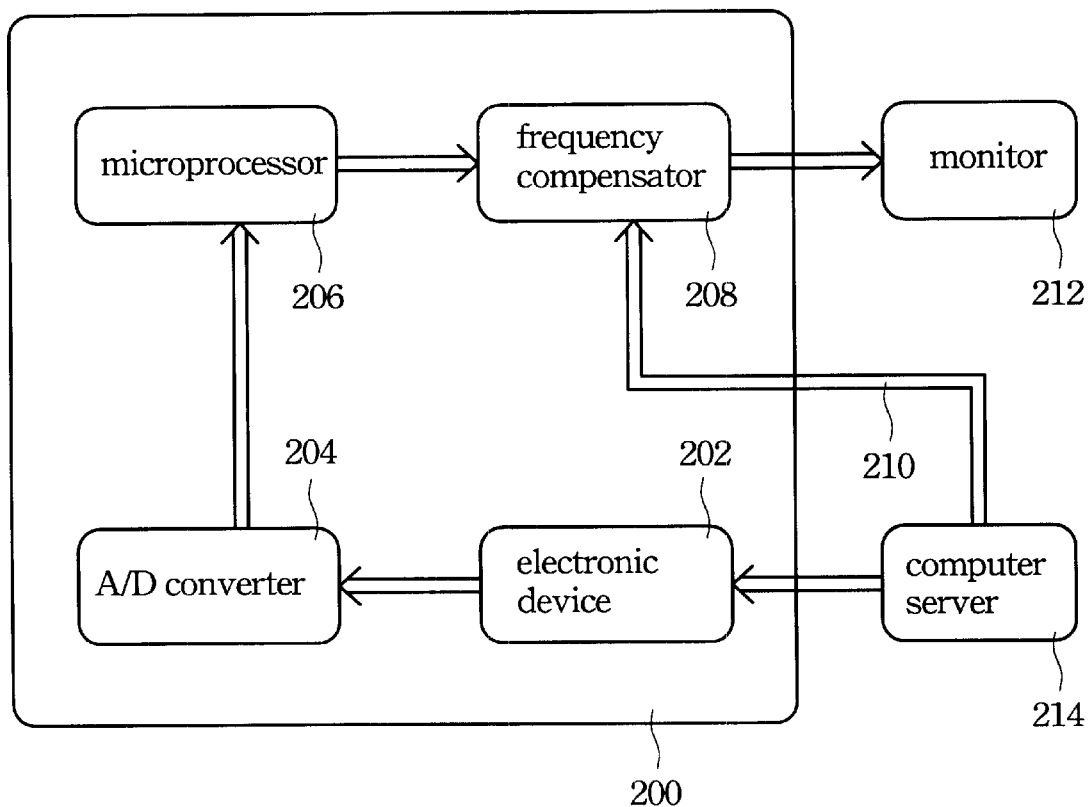
FIG. 2 illustrates an electronic apparatus for automatically detecting the length of a network transmission line according to the present invention.
Figure 3:
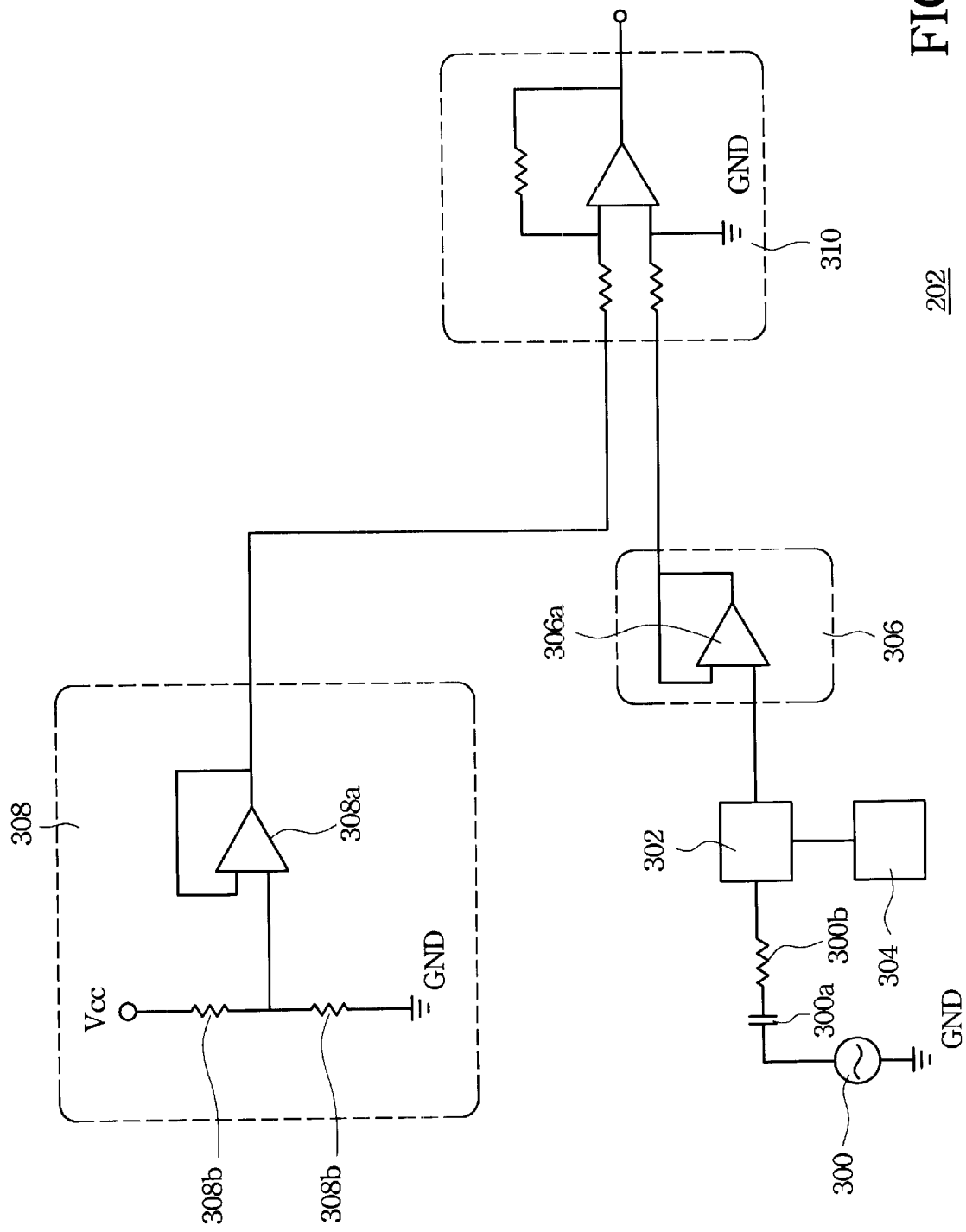
FIG. 3 illustrates a detection device of electronic apparatus in accordance with the present invention.

FIG. 2 illustrates an electronic apparatus 200 for automatically detecting the length of a network transmission line 210. The electronic apparatus 200 comprises a detection device 202, an analog/digital (A/D) converter 204, a microprocessor 206, a frequency compensator 208, and a network transmission line 210 connected to a remote computer server 214. FIG. 3 illustrates a detection device 202 of the electronic apparatus 200 in accordance with the present invention. The detection device 202 for generating the frequency response of a reference signal 300 essentially comprises a transistor detector 302, a temperature compensation circuit 304, an emitting follower 306, a zero-adjusting circuit 308 and a differential amplifier 310. The reference signal 300 generated by the remote computer server 214 is preferably a square wave of range between about 1 MHz and 100 MHz, and at least an capacitor 300a and at least one resistor 300b are able to isolate the direct current (DC) portion of the reference signal 300.

The transistor detector 302, preferably including at least one field effect transistor or bipolar transistor, is used to detect a detection level of the reference signal 300. The temperature compensator 304 coupled to the transistor detector 302 can compensate for a signal drift resulting in temperature variation of the transistor detector 302. The zero-adjusting circuit 308, preferably comprising amplifiers 308a and resistors 308b, can generate a zero level for reference. The differential amplifier 310, coupled to the transistor detector 302 and the zero-adjusting device 308, respectively, amplifies the difference between the detection level and the zero level to generate a detection signal. Preferably, the differential amplifier 310 includes a plurality of amplifiers and resistors. The emitting follower 306 respectively coupled to the transistor detector 302 and the differential amplifier 310 is used to enhance the detection level and comprises at least one amplifier. Due to the characteristic of higher output impedance and lower input impedance, the emitting follower 306 advantageously serves as a buffer between the reference signal 300 and differential amplifier 310.

The analog/digital (A/D) converter 204, coupled to the detection device 202, is able to convert the detection signal from the detection device 202 into a digital signal to generate a full-scale level via a reference voltage, such as a FF value in hexadecimals.

The microprocessor 206, coupled to the A/D converter 204, transfers digital signals into control signals to simultaneously control a plurality of switches for decaying the over-compensation portion of the video frequency. In the preferred embodiment of the present invention, preferably seven sets of control signals for controlling the eight types of length by signal superposition, such as 10, 30, 50, 70, 90, 110, 130 and 150 meters, wherein the rest one of eight types length does not need to be compensated. Further the A/D converter 204 can be embedded in the microprocessor 206 to diminish the size of the electronic apparatus 200 and thus to decrease the manufacturing cost.

Figure 4:
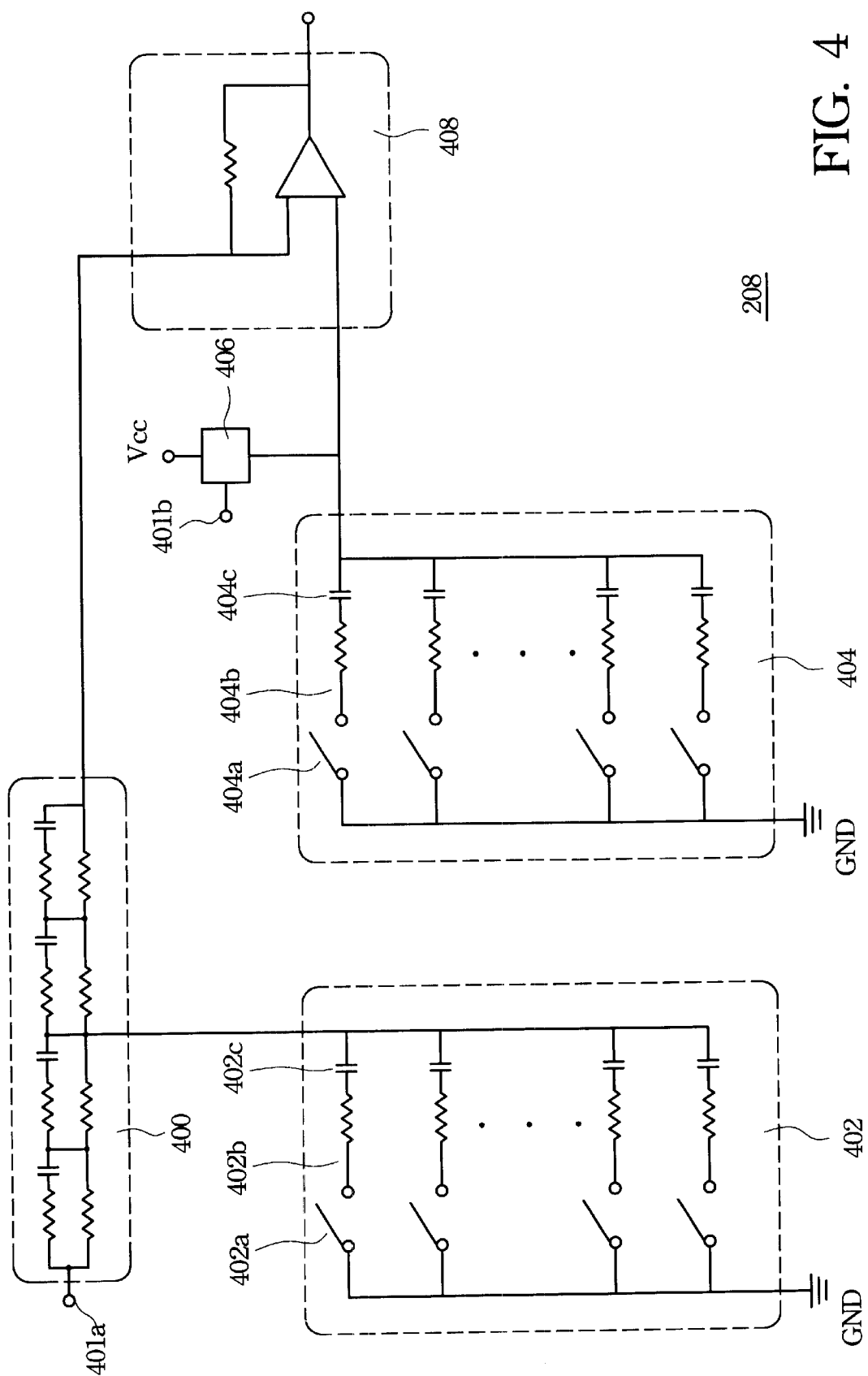
FIG. 4 illustrates a frequency compensator of electronic apparatus in accordance with the present invention.

Referring to FIG. 4, the figure shows a frequency compensator 208 of the electronic apparatus 200 in accordance with the present invention. The frequency compensator 208, coupled to the microprocessor 206 via network transmission line 210 and to a monitor 212, comprises a frequency-gained circuit 400, a negative decayed device 402, a pull-up circuit 406, a positive decayed device 404 and other amplified circuits 408.

The frequency-gained device 400 is used to adjust the bandwidth of the video frequency to the maximum level corresponding to the maximum length of the transmission line 210, such as a preferred 150 meters. At the status of the maximum bandwidth, the monitor 212 still has the best display quality. In addition, the video frequency is input from terminals 410a and 410b.

The negative decayed device 402, coupled to the frequency-gained circuit 400, has a plurality of decayed circuits and is able to decay the over-compensation portion of the video frequency for calibrating the video frequency. Each decayed circuit comprises at least a switch 402a, a resistor 402b and a capacitor 402c forming a RC circuit to make up for the negative portion of the video frequency.

The pull-up circuit 406, preferably including diodes, receives the video frequency and increases the signal level of video frequency, such as the signal level between base and emitter (BE) of a transistor.

The positive decayed device 404, coupled to the pull-up circuit 406, is capable of decaying a positive over-compensation portion of the video frequency. Thereafter the negative over-compensation portion and the positive over-compensation portion of the video frequency are simultaneously output to a monitor 212 by the differential amplifier 310. The positive decayed device 404 preferably comprises a plurality of decayed circuits. Each decayed circuit has at least a switch 404a, a resistor 404b and a capacitor 404c forming a RC circuit to decay the positive portion of the video frequency.

In the period of detection, the detection device 202 receives the reference signal 300, such as square wave of about 8 MHz transmitted for three seconds at a time and having a duty cycle of 1 mini-second (ms). Thus, the detection device 202 can complete the calibration procedure of the frequency response. Thereafter, the reference signal 300 passes through the capacitor 300a used for isolation of the DC portion thereof. Next, the transistor detector 302 performs a process of detection to generate a detection level corresponding to the reference signal 300. Also, the signal drift due to temperature variation of the transistor detector 302 can be corrected to acquire a better detection level. Afterwards, the differential amplifier 310 amplifies the difference between the detection level and the zero level to generate a detection signal. Finally, the detection signal is output into the A/D converter 204.

When the video frequency is transmitted via the network transmission line 210, the frequency-gained circuit 400 adjusts the bandwidth of the video frequency to the maximum bandwidth corresponding to the maximum transmission length. Most importantly, the detection device 202 effectively detects the frequency response of the network transmission line 210 corresponding to the detection signal converted into digital signal by the A/D converter 204. The digital signal corresponds to the length and the type of the network transmission line 210. Thereafter, the microprocessor 206 creates control signals transferred into the switch devices of the frequency compensator according to the type of network transmission line 210 so that over-compensation or under-compensation of the video frequency is calibrated. The frequency-gained device 400 preferably is used to enhance the video frequency and decay the video frequency for a better signal intensity.

In the present invention. the connectors (not shown in the figure) used for the transmission line 210 preferably comprise RJ-connector, such as RJ-45 and RJ-11 connectors. Furthermore, six lines of each transmission line, such as STP and FTP, are divided into three pairs for transmitting the primary colors of video frequency and each pair has a differential input.

In summary, the electronic apparatus 200 allows detection of the length of the transmission line 210 and then generates a compensated video frequency signal which is output to the monitor 212 such that the remote computer server 214 can display a clear image for the benefit of operation convenience.

As is understood by a person skilled in the art, the foregoing preferred embodiments of the present invention are illustrative rather than limiting of the present invention. It is intended that various modifications and similar arrangements be included within the spirit and scope of the appended claims, the scope of which should be accorded the broadest interpretation so as to encompass all such modifications and similar structure.

What is claimed is:

1. An electronic apparatus for automatically detecting a length of a network transmission line, comprising:
    a detection device for generating a frequency response of a reference signal, said detection device comprising:
        a transistor detector for detecting a detection level corresponding to said reference signal;
        a zero-adjusting, device for generating a zero level; and
        a differential amplifier, coupled to said transistor detector and said zero-adjusting device, respectively, for amplifying a difference between the detection level and the zero level to generate a detection signal;
    an analog/digital converter, coupled to said detection device, for converting the detection signal into a digital signal to generate a full-scale level via a reference voltage;
    a microprocessor, coupled to said analog/digital converter, for transferring the digital signal into a control signal; and
    a frequency compensator, coupled to said microprocessor via said network transmission line, the frequency compensator comprising a decayed device, wherein the decayed device receives a video frequency from said network transmission line and applies the control signal to said decayed device to compensate the video frequency.

2. The electronic apparatus of claim 1, wherein said network transmission line comprises an RJ-45 type of transmission line.

3. The electronic apparatus of claim 1, wherein said reference signal has a frequency between about 1 MHz and 100 MHz.

4. The electronic apparatus of claim 1, further comprising a temperature compensator, coupled to said transistor detector, for compensating a signal drift resulting in temperature variation of said transistor detector.

5. The electronic apparatus of claim 1, further comprising an emitting follower, coupled to said transistor detector and said differential amplifier, respectively, for enhancing the detection level.

6. The electronic apparatus of claim 1, wherein said zero-adjusting device comprises an emitting follower.

7. The electronic apparatus of claim 1, wherein said frequency compensator comprises:
    a frequency-gained device, for adjusting the video frequency to an optimum bandwidth;
    a negative decayed device, coupled to said frequency-gained device, for decaying a negative over-compensation portion of the video frequency;
    a pull-up circuit, for increasing signal level of the video frequency; and
    a positive decayed device, coupled to said pull-up circuit, for decaying a positive over-compensation portion of the video frequency, the negative over-compensation portion and the positive over-compensation portion of the video frequency then being output to a monitor by said differential amplifier.

8. The electronic apparatus of claim 7, wherein said network transmission line is a shielding twisted pair (STP) or a foil twisted pair (FTP).

9. The electronic apparatus of claim 8, further comprising a RJ socket for receiving said network transmission line.

10. The electronic apparatus of claim 1, wherein said microprocessor comprises a single chip controller.

11. An electronic apparatus for automatically detecting a length of a network transmission line, comprising:
    a detection device for generating a frequency response of a reference signal;
    an analog/digital converter, coupled to said detection device, for converting a detection signal into a digital signal to generate a full-scale level via a reference voltage;
    a microprocessor, coupled to said analog/digital converter, for transferring the digital signal into a control signal; and
    a frequency compensator, coupled to said microprocessor via said network transmission line, said frequency compensator comprising a decayed device, wherein said decayed device receives a video frequency from said network transmission line and applies the control signal to said decayed device to compensate the video frequency, said frequency compensator further comprising:
        a frequency-gained device, for adjusting the video frequency to an optimum bandwidth;
        a negative decayed device, coupled to said frequency-gained device, for decaying a negative over-compensation portion of the video frequency;
        a pull-up circuit, for increasing signal level of the video frequency; and
        a positive decayed device, coupled to said pull-up circuit, for decaying a positive over-compensation portion of the video frequency, the negative overcompensation portion and the positive overcompensation portion of the video frequency then being output to a monitor.

12. The electronic apparatus of claim 11, wherein said detection device comprises:

a transistor detector for detecting a detection level corresponding to said reference signal;

a temperature compensator, coupled to said transistor detector, for compensating a signal drift resulting in temperature variation of said transistor detector;

a zero-adjusting device for generating a zero level;

a differential amplifier, coupled to said transistor detector and said zero-adjusting device, respectively, for amplifying a difference between the detection level and the zero level to generate the detection signal; and an emitting follower, coupled to said transistor detector and said differential amplifier, respectively, for enhancing the detection level.

13. The electronic apparatus of claim 11, wherein said network transmission line comprises a RJ-45 type of transmission line.

14. The electronic apparatus of claim 11, wherein said reference signal has a frequency between about 1 MHz and 100 MHz.

15. The electronic apparatus of claim 11, wherein said network transmission line is a shielding twisted pair (STP) or a foil twisted pair (FTP).

16. The electronic apparatus of claim 11, further comprising a RJ socket for receiving said network transmission line.

17. The electronic apparatus of claim 11, wherein said microprocessor comprises a single chip controller.

18. A detection device applied to an electronic apparatus for automatically detecting a length of a network transmission line, said detection device comprising:

a transistor detector for detecting a detection level corresponding to a reference signal;

a temperature compensator, coupled to said transistor detector, for compensating a signal drift resulting in temperature variation of said transistor detector;

a zero-adjusting device for generating a zero level; and a differential amplifier, coupled to said transistor detector and said zero-adjusting device, respectively, for amplifying a difference between the detection level and the zero level to generate a detection signal; and an emitting follower, coupled to said transistor detector and said differential amplifier, respectively, for enhancing the detection level.

19. The detection device of claim 18, wherein said reference signal has a frequency between about 1 MHz and 100 MHz.

20. The detection device of claim 18, wherein said network transmission line is a shielding twisted pair (STP) or a foil twisted pair (FTP).

* * * * *